United States Patent [19]

Forster

[11] 4,100,492
[45] Jul. 11, 1978

[54] HARMONIC MAGNETIC FIELD PROBE WITH NOVEL CORE CONSTRUCTION

[76] Inventor: Friedrich M. O. Förster, D-7410 Reutlingen 1, In Laisen 70, Fed. Rep. of Germany

[21] Appl. No.: 681,814
[22] Filed: Apr. 30, 1976
[51] Int. Cl.² ............................................. G01R 33/04
[52] U.S. Cl. .................................... 324/254; 336/234
[58] Field of Search ................ 324/43 R, 47; 336/234

[56] References Cited

U.S. PATENT DOCUMENTS

| | | | |
|---|---|---|---|
| 2,606,229 | 8/1952 | Brewer et al. | 324/43 R |
| 2,743,416 | 4/1956 | Kelly, Jr. | 324/43 R |
| 3,168,696 | 2/1965 | Schonstedt | 324/43 R |
| 3,350,670 | 10/1967 | Strauch | 336/234 |
| 3,434,047 | 3/1969 | Brickner | 324/43 R |
| 3,445,928 | 5/1969 | Beynon | 324/43 R |

Primary Examiner—Robert J. Corcoran
Attorney, Agent, or Firm—George J. Netter

[57] ABSTRACT

The elongated core of a magnetic field probe is constructed of a heat-resistant diamagnetic body with lengthwise openings into which are received closely fitting wires of a magnetizable material. The wires are secured to the body by a heat-resistant cement. An excitation winding wound onto the core extends substantially beyond the core wire ends and a receiver winding is slidably received on the core.

7 Claims, 7 Drawing Figures

U.S. Patent  July 11, 1978  Sheet 1 of 2  4,100,492
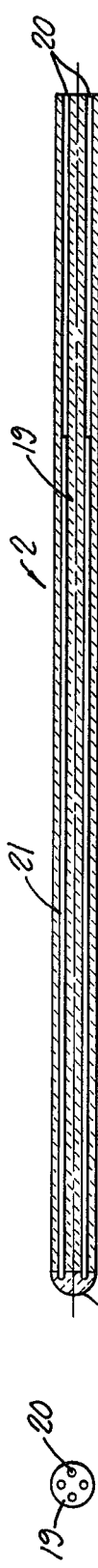
Fig. 3b.
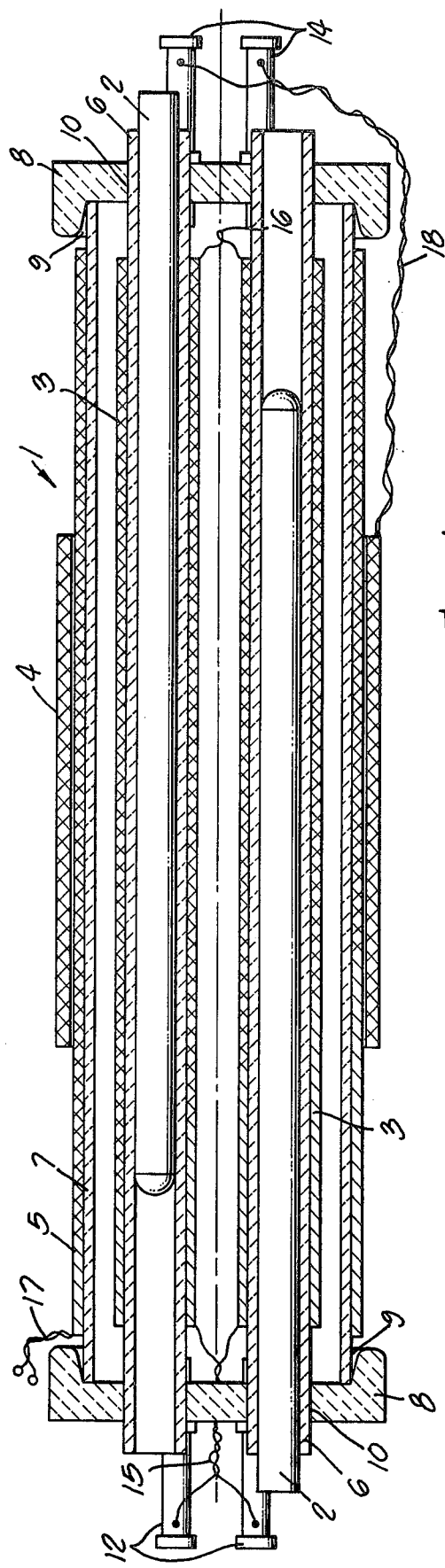
Fig. 1.
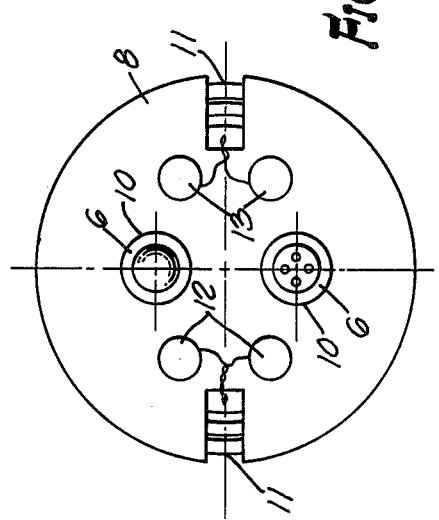
Fig. 3a.
Fig. 2.

HARMONIC MAGNETIC FIELD PROBE WITH NOVEL CORE CONSTRUCTION

The invention relates generally to a harmonic magnetic probe for the measurement of magnetic fields or magnetic field gradients, which more particularly has at least one elongated, magnetizable probe core, with one or more alternating current carrying excitation windings for the achievement of alternating magnetic saturation of the probe cores, the excitation windings encompassing one or a plurality of probe cores. In addition, at least one electrical receiver winding is provided for the pickup of a signal at the winding terminals, which signal is proportional to the magnetic fields or magnetic field gradients to be measured, which electrical receiver winding encompasses one or a plurality of probe cores and the excitation windings are at the same time usable as receiver windings.

BACKGROUND OF THE INVENTION

Probes of the aforementioned type have been successfully operating for decades for the measurement of small and extremely small magnetic fields or field gradients in a great variety of technological and research applications. One important application for these probes is as a magnetic detector, which, due to the disturbances of the geomagnetic field, are capable of assisting in the determination of the presence and location of hidden ferro-magnetic bodies causing such disturbances, as, for example, bomb shells, sunken ships and the like. Recently, the aforementioned probes are being increasingly used in the exploration of space.

Various embodiments of these probes are known. In "Zeitschrift fur Metallkunde" ("Magazine for Metal Arts"), volume 46 (1955), issue 5, Dr. Forster describes a probe having two probe cores and, respectively, one excitation winding and one receiver winding for each probe core. Also, U.S. Pat. No. 2,752,564 discloses a probe having two probe cores and two windings encompassing one of the probe cores, respectively, which windings, together with a symmetrical excitation current source are arranged in a bridge circuit. In FIG. 4 of this same patent is also shown a probe which has only one probe core with one winding.

Irrespective of the aforementioned embodiments, the material, shape and pretreatment of the probe core are of the utmost importance for the proper functioning of a probe as well as for the uniformity of its properties. This applies in particular to high resolution, sensitive probes. Hence, good probe cores are made from highly permeable, almost non-hysteretic alloys with low remanence.

Although the basic effect for harmonic probes was discovered in nickel wires, oblong, thin nickel strips are almost exclusively used as probe cores for qualified probes. This is mainly due to the fact that in wire-shaped cores eddy currents are caused by the alternating excitation field to an undesirably high degree. Due to the relatively high temperature dependence of electrical conductivity, these eddy currents cause an unacceptable temperature variation of the probes. In order to keep the resulting eddy currents small, it was therefore obvious to use relatively thin probe cores. On the other hand, the resolution of the sensitive probes is limited by the noise resulting from so-called Barkhausen discontinuities which occur in the probe core due to irregularities during the tipping of the magnetic moments of the Weiss' domains and which produce voltage signals at the probe output. As the probe noise is closely related to the cross-section of the probe core, attempts were made to attain a certain minimum cross-section by means of appropriate lateral dimensions and thus the striplike shape of the probe cores was obtained.

High quality probe cores, in any case, require pretreatment which consists in careful annealing of the core material. On the one hand, this treatment eliminates all mechanical stress conditions in the probe core, and, on the other hand, the core is safely converted to the magnetically soft condition. After annealing, any further contact of the probe core by hand or tools should be avoided as far as possible, to prevent the generation of new stress conditions.

With the increased demands made on harmonic probes, in particular due to the more frequent application in space research, serious disadvantages of the currently used technology became apparent. According to the previous practice, a probe strip is arranged between two textile threads and in most cases is drawn into a hole in a tubule which carries the probe winding, the two textile threads being used for the drawing in. Probe alignment is effected by displacing the probe strip to determine the optimum position and by subsequently fixing the probe strip. Naturally, the easy movability of the probe strip, which is required for the alignment and which is achieved by ensuring an appropriate degree of play, is accompanied by a loss of stability of the strip position. Anyhow, the shape of the strip, in combination with the given suspension of the strip between two threads, admits the possibility of strip distortion, in particular at the edges and corners. Bending of the thin strip cannot be precluded, either. These disadvantages are especially important if high accelerations must be supported during space missions.

In the case of gradient probes, which are used to determine small field variations within strong ambient magnetic fields and which applies to the above mentioned detectors, an additional requirement is that the parallelism of the two differentiating probe halves, i.e., the parallelism of the associated probe strips, must be ensured with extreme accuracy. With previous known probe strips this was not always possible to the desired extent.

A further disadvantage of known probes exists in that, after annealing, the probe must additionally be manipulated during the alignment, since the generation of new strains cannot be avoided in all cases. It is also disadvantageous that strip probes show considerable differences of the demagnetizing factor in the transverse direction to the probe core longitudinal axis. The demagnetizing factor is considerably smaller in the direction of the strip width than in the direction of the strip thickness, so that in the preferred direction of the strip width magnetic field, interferences transversely to the probe axis may result.

In addition, paired probes are characterized by the particularly undesirable fact that two probe strips with exactly the same properties must be found. In practice, this problem is solved by arranging a first probe strip in the opening of the first probe half, and, subsequently, by successively inserting a plurality of probe strips into the opening of the second probe half until a sufficiently small residual voltage is obtained at the probe output. Here it becomes evident that, given the core shape of the probe strip, it is particularly difficult to bring the geometric and magnetic parameters for two probe strips into agreement.

OBJECTS AND SUMMARY OF THE INVENTION

An object of the present invention is to provide a harmonic probe which, with small eddy current losses and low probe noise, shows a good stability of probe core shape and position, even when subjected to high acceleration forces. Furthermore, in all directions vertically to the probe axis this harmonic probe shall, to the same extent, remain unaffected by external magnetic fields. A simple alignment of the harmonic probe shall also be possible. In the case of probe strip pairing, the prospects of success shall be improved.

In accordance with the practice of this invention, there is provided a harmonic probe which has decided advantages over the probes hitherto known. A plurality of thin wires from magnetizable material are used in each probe core, whereby an effective probe core cross-section is obtained which ensures low noise without appreciable eddy current losses. Due to their sectional form, wires naturally have a moment of resistance which is constant in all directions of the wire periphery and the wires used for the probe core are accommodated in openings with close tolerances so that their position is supported by the walls of the openings. In addition, the slight changes in position which are still possible within the remaining little play are largely adjusted statistically. The body accommodating the wires can be made of adequate strength and fixed in a satisfactory manner. The small mass of each individual wire considerably reduces the sensitivity to acceleration forces. As far as magnetism is concerned, there is no preferred direction transversely of the probe axis, as is the case with strip probes. Still further, an improved geometric and metallurgical homogeneity of the probe cores is achieved according to the invention, which is attributable to the method of wire manufacture, in that it makes it possible to completely dispense with the toilsome and time-consuming selection method for the pairing of probe cores, provided only that the wires are cut to the exact lengths. The small number of probe core pairs which do not meet the requirements may be easily replaced during further alignment. Thus, for the case mentioned, a particularly economical alignment method is obtained.

According to a further aspect of the invention, the oblong body which accommodates the magnetizable wires is made from a heat-resistant material. Accordingly, the material for the probe core can be annealed after it has been accommodated in the holes of said body and it can be inserted and fixed in the probe without further contact with or manipulation of the core wires. In this way, any subsequent generation of stress conditions in the probe core is avoided. The fact that the receiver winding is shorter than the ferromagnetic core material and that it can be displaced relative to the core material, is also considered as a feature of the invention.

DESCRIPTION OF THE DRAWING

FIG. 1 is a longitudinal sectional view of a probe constructed in accordance with this invention.

FIG. 2 is an end elevation of the probe according to FIG. 1.

FIGS. 3a and 3b shown an end and side elevation of the probe core, respectively.

DESCRIPTION OF PREFERRED EMBODIMENTS

Figure 5:
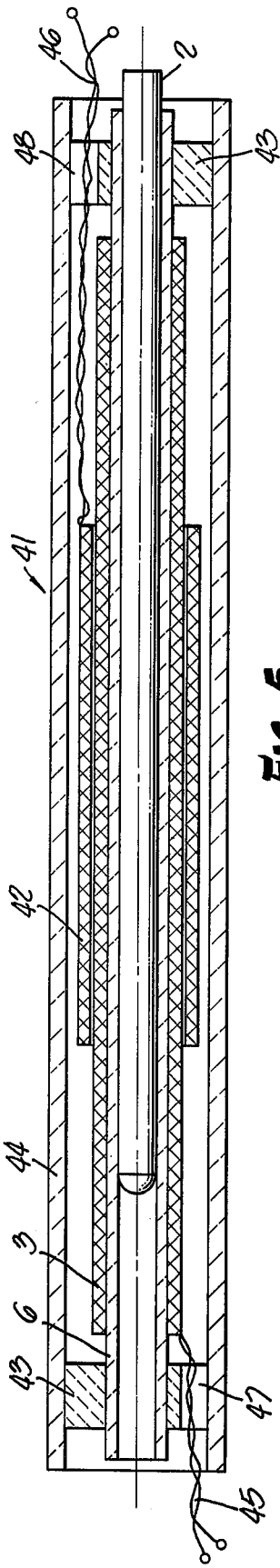
FIG. 5 is a sectional, elevational view of a half probe or single probe.

FIGS. 1 through 3 show, in approximately fourfold magnification, a magnetic field probe 1, the essential components of which are two elongated probe cores 2, two excitation windings 3 encompassing the probe cores and one receiver winding 4 encompassing the probe cores and excitation windings. Another winding 5, shown in FIG. 1, which is not basically required for the function of the probe, operates as negative feedback winding for a purpose to be explained later. The two probe cores 2 are fittingly inserted into two tubules 6 which simultaneously serve as forms for the excitation windings 3. The negative feedback winding 5 is wound on a tubule 7 while the receiver winding 4 is self-supporting and can optionally be displaced in the axial direction along the negative feedback windings 5 for alignment purposes.

The tubules 6 and 7 are held together by two end discs 8 whereas the tubules 6 are inserted into holes 10 of the end discs. The two end discs 8 are at the same time used for the suspension of the complete field probe 1, e.g., in an outer tube which is not represented in the drawings. This type of suspension is a considerable improvement of stability as compared to previously used suspension existing primarily at the outermost probe winding. Two slots 11 enable the connection terminals of the various windings to be led out to the soldering back-up points 12, 13 and 14 provided for this purpose, which are retained in holes of the end discs 8. The connection terminals 15 of the two excitation windings 3 which are connected in series opposition via the two interconnected remaining connection terminals 16, are located at the soldering back-up points 12. Similarly, the connection terminals 17 of the negative feedback winding 5 are located at the soldering back-up terminal 13, while the connection terminals 18 of the receiver winding 4 are located at the soldering back-up point 14.

Of special importance for the present invention is the configuration of the two probe cores 2 which are represented separately in FIGS. 3a and 3b. FIG. 3a shows an end elevation, and FIG. 3b a longitudinal section of the probe cores taken of FIG. 3a. The supporting component is an elongated cylindrical body 19 made of heat-resistant, preferably ceramic material which has four equidistantly spaced holes 20 arranged in a circle around the longitudinal axis of body 19. The holes 20 extend in good parallelism through the entire length of body 19; in the present case their diameter is 0.11 mm. Four wires 21 of a high-quality ferromagnetic material are introduced into the holes 20, the wire diameter being slightly smaller than the diameter of the holes 20, i.e., approximately 0.1 mm. The wires 21 are shorter than the length of the excitation winding 3 so that they are located within the homogeneous domain of the excitation field. The length of the receiver winding 4 is shorter than the length of the wires 21 and it is adapted for the relative displacement in the axial direction so that it can be brought into a symmetrical position relative to the probe core wires 21.

In the manufacture of probe cores 2, careful attention is paid to the exact equality in length of the wires 21. It is also important that all four wires 21 extend from the body 19 the same amount. By means of a heat-resistant bonding agent, e.g., by means of a so-called ceramic cement, a bonded joint 22 is produced without changing the position of the wire ends. The probe cores 19 formed in this manner can now be subjected to the usual annealing treatment. Consequently, the ferromagnetic material of the wires 21 does not come into contact with any tool after the annealing, such as when the probe cores 2 are being introduced into the tubules 6 for alignment purposes, for example. The probe cores 2 are introduced from different sides in order to adjust the slight inhomogeneity of the wires 21 which results at the bonded joint 22.

Figure 4:
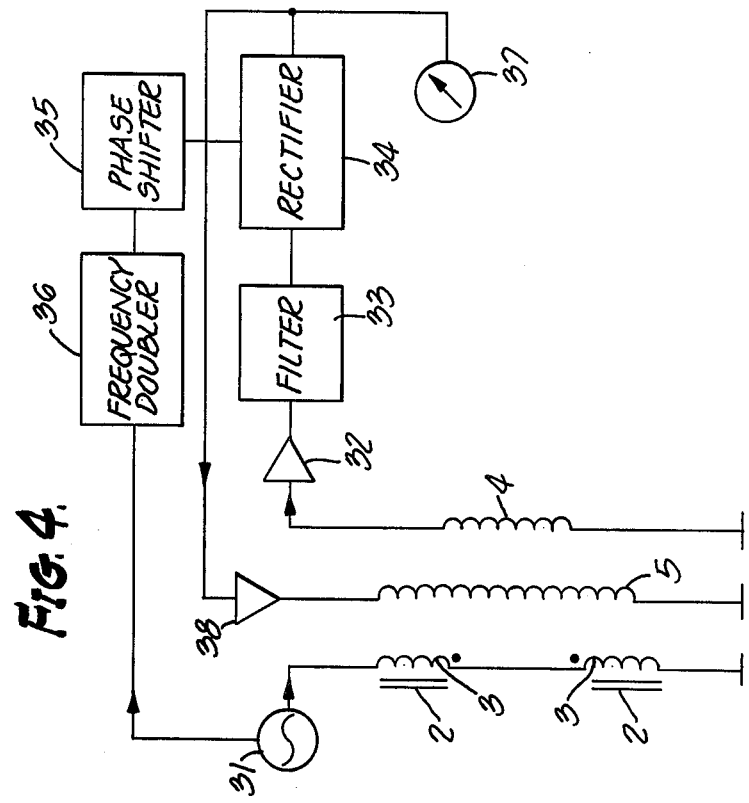
FIG. 4 is a schematic circuit diagram for the probe according to FIG. 1.

FIG. 4 shows one form of schematic circuit diagram for the field probe 1 already described. According to this circuit, an alternator 31 feeds the two excitation windings 3 which are connected in series opposition and alternately causes magnetic saturation of the cores 2. In receiver winding 4 the components of the fundamental wave of the excitation signal essentially cancel each other due to the opposing circuitry. If the cores are under the influence of an external field a symmetry shift of the magnetization characteristic is produced resulting in a magnetic flux which is proportional to the external field and which has the frequency of even numbered harmonics of the generator frequency as well as in a corresponding signal voltage in the receiver winding 4. Amplifier 32 amplifies the signal and in filter 33 the second harmonic is separated from the signal voltage and fed to the controlled rectifier 34. The rectifier is supplied with control voltage from generator 31 via a serially related phase shifter 35 and a frequency doubler 36. The demodulated signal voltage from 34 is applied to a measuring instrument 37, the deflection of which indicates the quantity of the external field measured. In case a negative feedback is desired, as for example for the linearization of the probe characteristic, the demodulated signal voltage is fed to the negative feedback winding 5 via amplifier 38 and counteracts the effect of the external field being measured.

The alignment of probe 1 is initiated by first inserting the probe cores 2 into the tubules 6 so that the wires 21 are located approximately in the middle of the homogeneous region of the excitation field. In this position, the selection of which is not particularly critical, the probe core is carefully fixed. Next, the receiver winding 4 is shifted and fixed in such position that a minimum of residual voltage is obtained in the absence of an external field. In almost all cases satisfactory alignment can be achieved in this simple manner. Should this not be the case, i.e., if a sufficiently small minimum voltage is not obtained, another pair of probe cores 2 can be inserted and the alignment can be repeated.

A pair of magnetic field probes of the type described above a gradient probe or search probe can be assembled. In addition, this requires a setting mechanism by means of which the two field probes (which are spaced at a fixed distance from each other) can be aligned to exact parallelism. Homogeneous magnetic fields, as for example the geomagnetic field, are suppressed by connecting the field probes back-to-back.

FIG. 5 shows a half-probe 41, two of which, depending on the polarity, can be interconnected to form a magnetic field probe or a gradient probe, but which can also be operated independently as an individual probe. For the half-probe 41, largely the same elements are used as for field probe 1. A probe core 2 which corresponds to that represented in FIG. 3, is slidably arranged in a tubule 6 which carries an excitation winding 3. The excitation winding 3 carries a receiver winding 42 the length of which may be approximately the same as the length of the previously described receiver winding 4. Tubule 6 is retained in a protective tube 44 by means of two end discs 43. The connection terminals 45 and 46, respectively, of the two windings 3 and 42, are brought out through slots 47 and 48 of the end discs 43.

Figure 6:
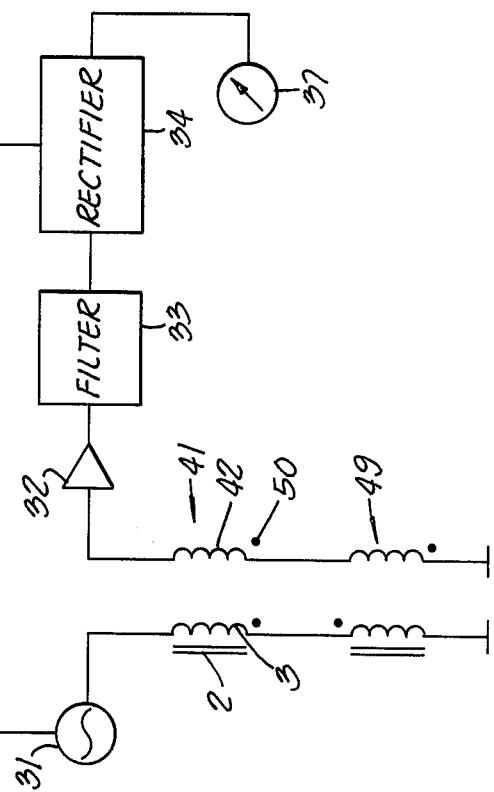
FIG. 6 is a schematic circuit diagram for use with half probes according to FIG. 5.

FIG. 6 shows a schematic circuit diagram for the operation of a pair of half-probes 41 and 49 which are identical in all details. In the present case they are interconnected as a magnetic field probe. This is illustrated by the polarity points 50 which, respectively, mark the beginning of a winding for the same direction of winding and hence indicate that the excitation windings of the two half probes are arranged in opposing series connection, while the receiver winding is in aiding series connection. By turning of one of the two half-probes or by reversal of the polarity of the terminals of the excitation and receiver windings in one of the two half-probes 41 or 49, the field probe can be converted to a gradient probe. For the power supply of the probe and for the processing of the signal voltage, the same circuit apparatus 31 through 37 is provided as in FIG. 4.

Naturally, in the application of the probes described above, the control voltage for the controlled rectifier and the generator voltage for the probe excitation can be obtained from a voltage with a higher frequency by means of multiple frequency division, thus making the use of a frequency doubler superfluous. Likewise, the use of a controlled rectifier may also be unnecessary, since the probes can be operated in a bridge circuit, or another known type of probe circuitry can be used without departing from the basic idea of the invention. In the case of bridge circuit probe operation, the excitation windings can simultaneously be used as receiver windings, i.e., separate receiver windings are not required in this case.

What I claim is:

1. In a harmonic magnetic probe for the measurement of magnetic fields or magnetic field gradients having at least one elongated magnetizable probe core, with at least one alternating current carrying excitation winding for effecting alternating magnetic saturation of the probe core, and at least one receiver winding for providing an electric signal at the terminals of said winding, which signal is proportional to the magnetic fields or magnetic field gradients being measured, said electrical receiver winding encompassing at least one probe core, the improvement comprising:

an elongated diamagnetic body having a plurality of parallel straight-line openings extending therethrough, said openings having uniform cross-sections and arranged symmetrically about and equally spaced from a longitudinal axis of said body; and a corresponding plurality of magnetizable wires individually received within the body openings, each of said wires having cross-sectional dimensions such that it is received within the body opening in a closely fitting relationship, said diamagnetic body and included wires forming a probe core.

2. The harmonic probe according to claim 1, in which the elongated diamagnetic body is constructed of a heat-resistant ceramic.

3. The harmonic probe according to claim 1, in which the magnetizable wires are affixed to said diamagnetic body by means of heat resistant cement.

4. The harmonic magnetic probe according to claim 1, in which said diamagnetic body with the wires contained therein is heat treated.

5. The harmonic magnetic probe according to claim 1, in which there are provided a pair of probe cores
   one end portion of the diamagnetic body of each core including the outer ends of the openings having a body joint, the two probe cores being arranged in end-opposed parallel relation to one another with the body joints of the two probe cores being at opposite ends thereof.

6. The harmonic magnetic probe according to claim 1, in which the receiver winding is substantally shorter than the magnetizable probe wires and the receiver winding is displaceable relative to the probe wires.

7. The harmonic probe according to claim 1, in which the excitation winding is substantially longer than the magnetizable wires.

* * * * *